(12) United States Patent
No (10) Patent No.: US 11,379,148 B2
(45) Date of Patent: Jul. 5, 2022

(54) SEMICONDUCTOR DEVICE

(71) Applicant: SK hynix Inc., Icheon (KR)

(72) Inventor: Su Hyuck No, Seoul (KR)

(73) Assignee: SK hynix Inc., Icheon (KR)

( * ) Notice: Subject to any disclaimer, the term of this patent is extended or adjusted under 35 U.S.C. 154(b) by 17 days.

(21) Appl. No.: 16/244,001

(22) Filed: Jan. 9, 2019

(65) Prior Publication Data

US 2019/0220229 A1   Jul. 18, 2019

(30) Foreign Application Priority Data

Jan. 17, 2018   (KR) .................. 10-2018-0005934

(51) Int. Cl.
```
G06F 3/06      (2006.01)
G06F 13/16     (2006.01)
G11C 29/52     (2006.01)
G06F 11/10     (2006.01)
G11C 7/20      (2006.01)
G11C 5/04      (2006.01)
```

(52) U.S. Cl.
CPC .......... *G06F 3/0659* (2013.01); *G06F 3/0619* (2013.01); *G06F 3/0679* (2013.01); *G06F 11/1068* (2013.01); *G06F 13/16* (2013.01); *G11C 29/52* (2013.01); *G11C 5/04* (2013.01); *G11C 7/20* (2013.01)

(58) Field of Classification Search
CPC .... G06F 3/0659; G06F 3/0679; G06F 3/0619; G06F 3/0644; G06F 3/0688; G06F 13/16; G06F 11/1068; G06F 11/1048; G11C 29/52; G11C 29/42; G11C 8/12; G11C 7/20; G11C 5/04

See application file for complete search history.

(56) References Cited

U.S. PATENT DOCUMENTS

| | | | |
|---|---|---|---|
| 10,191,866 B2* | 1/2019 | Hampel | G06F 13/1678 |
| 2013/0339574 A1* | 12/2013 | Franceschini | G06F 12/0292 |
| | | | 711/103 |
| 2016/0132265 A1* | 5/2016 | Yi | G06F 3/0614 |
| | | | 711/105 |
| 2017/0329719 A1 | 11/2017 | Hampel et al. | |
| 2019/0043600 A1* | 2/2019 | Saileshwar | G06F 11/1048 |

FOREIGN PATENT DOCUMENTS

| KR | 20130019999 A | 2/2013 |
|---|---|---|
| KR | 1020140029936 A | 3/2014 |
| KR | 1020150129941 A | 11/2015 |
| KR | 1020160076889 A | 7/2016 |
| KR | 20170085638 A | 7/2017 |
| KR | 20170098538 A | 8/2017 |

* cited by examiner

*Primary Examiner* — April Y Blair
*Assistant Examiner* — Rong Tang (57) ABSTRACT

A semiconductor device comprises a data region including a plurality of first semiconductor chips and configured to store data requested by a host, and a metadata region including one or more second semiconductor chips and configured to store metadata corresponding to the plurality of first semiconductor chips in the data region. The data region and the metadata region are accessed using different signals to perform a command-based operation corresponding to a command signal.

6 Claims, 9 Drawing Sheets

SEMICONDUCTOR DEVICE

CROSS-REFERENCE TO RELATED APPLICATION

This application claims priority under 35 U.S.C 119(a) to Korean patent application No. 10-2018-0005934, filed on Jan. 17, 2018, the disclosure of which is incorporated in its entirety by reference herein.

BACKGROUND OF THE INVENTION

Embodiments of the present disclosure relate to a semiconductor device, and more particularly, to a semiconductor device capable of reading or writing metadata.

A semiconductor device, such as a NAND flash memory device or a phase change memory device, has a limited number of times that a single cell can perform a write operation. Therefore, to manage the lifetime of the semiconductor device, the semiconductor device may store metadata including information about the number of write operations that have been performed on each cell and the like, in addition to data to be requested by a host.

BRIEF SUMMARY OF THE INVENTION

Various embodiments of the present disclosure are directed to providing a semiconductor device that substantially addresses one or more issues due to limitations and disadvantages of the related art.

Embodiments of the present disclosure relate to technology for allowing general data and metadata to be accessed separately from each other since each of the general data and the metadata is used for a different purpose.

In accordance with an embodiment of the present disclosure, a semiconductor device includes a first rank including a plurality of first semiconductor chips coupled to a first command transmission line and a first address transmission line. The first rank includes a first data region including a first set of the first semiconductor chips that is coupled to a first chip selection signal transmission line, and a metadata region including a second set of the first semiconductor chips that is coupled to a second chip selection signal transmission line.

In accordance with another embodiment of the present disclosure, a semiconductor device includes a first rank including a plurality of first semiconductor chips coupled to a first chip selection signal transmission line, a first command transmission line, and a first address transmission line, each of the plurality of first semiconductor chips being coupled to a corresponding one of a plurality of first data mask transmission lines. The first rank includes a first data region including a first set of the first semiconductor chips, and a metadata region including a second set of the first semiconductor chips. Each of the first semiconductor chips includes a data masking circuit configured to perform a data masking operation for deciding whether to perform an operation corresponding to a command signal in response to a corresponding data mask signal.

In accordance with another embodiment of the present disclosure, a semiconductor device includes a first rank including a plurality of first semiconductor chips coupled to a first chip selection signal transmission line, a first command transmission line, and a first address transmission line. The first rank includes a first data region including a first set of the first semiconductor chips, and a metadata region including a second set of the first semiconductor chips. Each of the first semiconductor chips includes a command masking circuit configured to decide whether to perform a command-based operation corresponding to a command signal, based on a value of a predetermined bit of an address signal.

In accordance with another embodiment of the present disclosure, a semiconductor device comprises a data region including a plurality of first semiconductor chips and configured to store data requested by a host, and a metadata region including one or more second semiconductor chips and configured to store metadata corresponding to the plurality of first semiconductor chips in the data region. The data region and the metadata region are accessed using different signals to perform a command-based operation corresponding to a command signal.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to the embodiments of the present disclosure, examples of which are illustrated in the accompanying drawings. The same or like reference numbers refer to the same or like parts throughout the various drawings and embodiments of the present disclosure.

Figure 1:
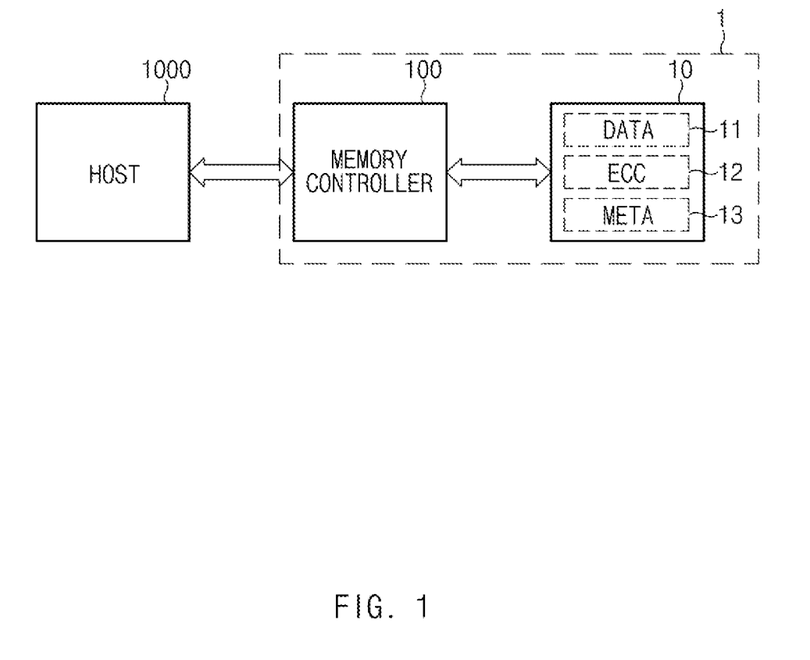
FIG. 1 illustrates a semiconductor system according to an embodiment of the present disclosure.

FIG. 1 illustrates a semiconductor system according to an embodiment of the present disclosure.

Referring to FIG. 1, the semiconductor system may include a host 1000 and a semiconductor device 1.

The host 1000 may include at least one operating system (OS). The operating system (OS) may support functions and operations corresponding to user's purposes, and may manage and control functions and operations of the host 1000.

The semiconductor device 1 may include a memory device 10 and a memory controller 100. The memory device 10 may store data, error correction code (ECC) data, and metadata. The memory controller 100 may control write and read operations of the data, the ECC data, and the metadata stored in the memory device 10. Although FIG. 1 shows the memory controller 100 and the memory device 10 that are separated from each other for convenience of description and better understanding of the present disclosure, the scope or spirit of the present disclosure is not limited thereto. In another embodiment, the memory controller 100 and the memory device 10 may be integrated into a single device as necessary.

The memory controller 100 may control the memory device 10 in response to a request from the host 1000. For example, the memory controller 100 may transmit data read from the memory device 10 to the host 1000, and may store data received from the host 1000 in the memory device 10.

The memory device 10 may include a data region (DATA) 11, an ECC region (ECC) 12, and a metadata region (META) 13. The data region (DATA) 11 may receive data from the host 1000, and may store the received data. The ECC region 12 may store ECC data that is used to detect and correct errors in the data stored in the data region 11. The metadata region 13 may store metadata that is used to control the semiconductor device 1. Herein, the data stored in the data region 11 may be referred to as 'general data' to distinguish from the ECC data and the metadata.

In response to a read command, the memory device 10 may perform a read operation, such that the general data stored in the data region 11 and the ECC data stored in the ECC region 12 are output, and/or the metadata stored in the metadata region 13 is output. In response to a write command, the memory device 10 may perform a write operation, such that write data from the host 1000 and ECC data corresponding to the write data are stored in the memory device 10, and/or metadata corresponding to the write data is stored in the memory device 10. The memory device 10 may allow the general data and the metadata to remain unchanged even when power is shut off or interrupted. Although the memory device 10 may be implemented as a non-volatile memory such as a NAND flash memory or a phase change memory, the scope or spirit of the present disclosure is not limited thereto.

Figure 2:
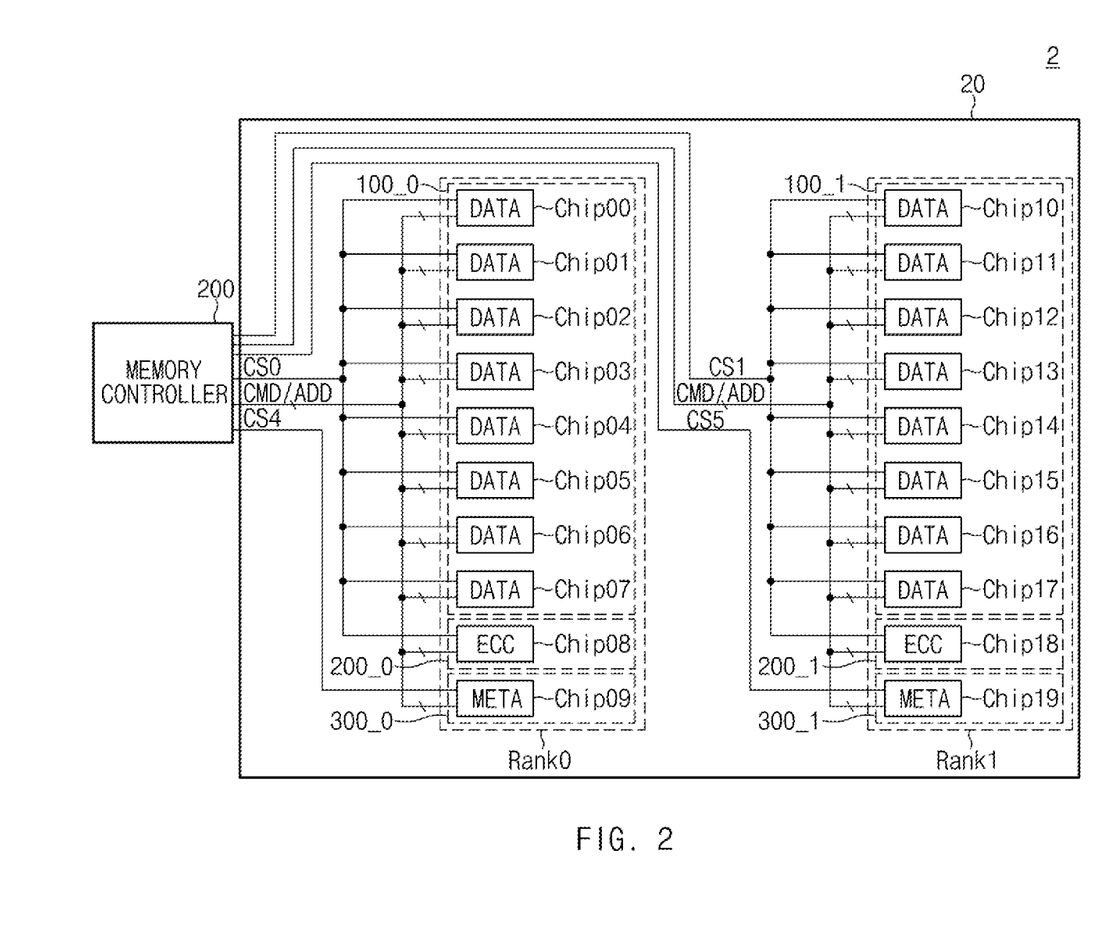
FIG. 2 illustrates a semiconductor device according to an embodiment of the present disclosure.

FIG. 2 illustrates a semiconductor device 2 according to an embodiment of the present disclosure. The semiconductor device 2, a memory controller 200, and a memory device 20 shown in FIG. 2 may correspond to the semiconductor device 1, the memory controller 100, and the memory device 10 shown in FIG. 1, respectively.

Referring to FIG. 2, the memory device 20 may include a plurality of ranks, e.g., Rank0 and Rank1, and each of the ranks Rank0 and Rank1 may include a plurality of semiconductor chips. For example, the rank Rank0 may include 10 semiconductor chips Chip00~Chip09. The rank Rank1 may include 10 semiconductor chips Chip10~Chip19. Each of the ranks Rank0 and Rank1 may be coupled to a corresponding command/address transmission line. Therefore, the corresponding command/address signals CMD/ADD may be simultaneously input to all semiconductor chips included in the same rank. Although FIG. 2 exemplarily illustrates a single command/address transmission line coupled to a single rank for convenience of description and better understanding of the present disclosure, the command/address transmission line coupled to the single rank may transmit command/address signals CMD/ADD composed of several bits. Although not shown in FIG. 2, data transmission lines may be respectively coupled to the semiconductor chips Chip00~Chip19.

Although FIG. 2 shows the memory device 20 that includes two ranks and each rank that includes 10 semiconductor chips for convenience of description and better understanding of the present disclosure, the scope or spirit of the present disclosure is not limited thereto. The number of ranks and the number of semiconductor chips included in each rank may be changed as necessary. In this embodiment shown in FIG. 2, the semiconductor chips Chip00~Chip19 may be identical in size to one another. For example, each of the semiconductor chips Chip00~Chip19 may have a size of 16 bytes.

The ranks Rank0 and Rank1 may correspond to pages Page0 (not shown) and Page1 (not shown), respectively. The rank Rank0 may include a data region 100_0, an ECC region 200_0, and a metadata region 300_0. The rank Rank1 may include a data region 100_1, an ECC region 200_1, and a metadata region 300_1. The data region 100_0 or 100_1, the ECC region 200_0 or 200_1, and the metadata region 300_0 or 300_1 shown in FIG. 2 may respectively correspond to the data region 11, the ECC region 12, and the metadata region 13 shown in FIG. 1. In this embodiment shown in FIG. 2, metadata stored in the metadata region 300_0 may be metadata for the rank Rank0, and metadata stored in the metadata region 300_1 may be metadata for the rank Rank1. For example, the metadata stored in the metadata region 300_0 or 300_1 may include a write count for the page Page0 or Page1 respectively corresponding to the rank Rank0 or Rank 1.

Each of the data regions 100_0 and 100_1 may include a plurality of semiconductor chips, for example, 8 semiconductor chips. In other words, the semiconductor chips Chip00~Chip07 may form the data region 100_0, and the semiconductor chips Chip10~Chip17 may form the data region 100_1. The semiconductor chip Chip08 may form the ECC region 200_0, and the semiconductor chip Chip18 may form the ECC region 200_1. The semiconductor chip Chip09 may form the metadata region 300_0, and the semiconductor chip Chip19 may form the metadata region 300_1. Although FIG. 2 exemplarily shows that a single semiconductor chip is allocated to each of the ECC regions 200_0 and 200_1, and another single semiconductor chip is allocated to each of the metadata regions 300_0 and 300_1, the scope or spirit of the present disclosure is not limited thereto. In another embodiment, multiple semiconductor chips may be allocated to each of the ECC regions 200_0 and 200_1, and other multiple semiconductor chips may be allocated to each of the metadata regions 300_0 and 300_1.

Semiconductor chips belonging to a data region and an ECC region within a rank may be coupled to the same chip selection signal transmission line. A semiconductor chip belonging to a metadata region within the rank may be coupled to a chip selection signal transmission line that is different from the chip selection signal transmission line coupled to the data region and the ECC region.

In this embodiment shown in FIG. 2, the semiconductor chips Chip00~Chip08 belonging to the data region 100_0 and the ECC region 200_0 of the rank Rank0 may be coupled to a chip selection signal transmission line CS0, and the semiconductor chips Chip10~Chip18 belonging to the data region 100_1 and the ECC region 200_1 of the rank Rank1 may be coupled to a chip selection signal transmission line CS1. The semiconductor chip Chip09 belonging to the metadata region 300_0 may be coupled to a chip selection signal transmission line CS4, and the semiconductor chip Chip19 belonging to the metadata region 300_1 may be coupled to a chip selection signal transmission line CS5.

In the above-mentioned semiconductor device 2, each metadata region 300_0 or 300_1 may be accessed separately from each data region 100_0 or 100_1 and each ECC region 200_0 or 200_1. For example, when the memory controller 200 may transmit the command/address signals CMD/ADD to the rank Rank0, the chip selection signal CS0 may be activated and the chip selection signal CS4 may be deactivated. In this case, the data region 100_0 and the ECC region 200_0 may be accessed, whereas the metadata region 300_0 may not be accessed.

On the other hand, when the memory controller 200 transmits the command/address signals CMD/ADD to the rank Rank0, the chip selection signal CS0 may be deactivated and the chip selection signal CS4 may be activated. In this case, the metadata region 300_0 may be accessed, whereas the data region 100_0 and the ECC region 200_0 may not be accessed.

A non-volatile memory is characterized in that performance of the non-volatile memory is deteriorated as the number of uses of the non-volatile memory increases. That is, general data stored in the non-volatile memory may be changed or lost as the number of uses increases. In addition, the number of access times of metadata may be lower than the number of access times of the general data.

In accordance with this embodiment, since it is possible to separately access the data region 100_0 or 100_1 from the metadata region 300_0 or 300_1 in the semiconductor device 2, the metadata region 300_0 or 300_1 is prevented from being unnecessarily accessed. As a result, it is possible to improve performance of the metadata region 300_0 or 300_1.

In the semiconductor device 2, performance deterioration of the data region 100_0 or 100_1 may be compensated for using the ECC data stored in each ECC region 200_0 or 200_1. Although ECC data may be used for compensating for performance deterioration of the metadata region 300_0 or 300_1, this may increase the size of the ECC data, such that the size of a data region in the memory device 20 may be reduced. The semiconductor device 2 according to this embodiment is designed in a manner that metadata can be separately accessed from general data and ECC data, such that the semiconductor device 2 can guarantee reliability of the metadata without storing ECC data for the metadata.

Figure 3:
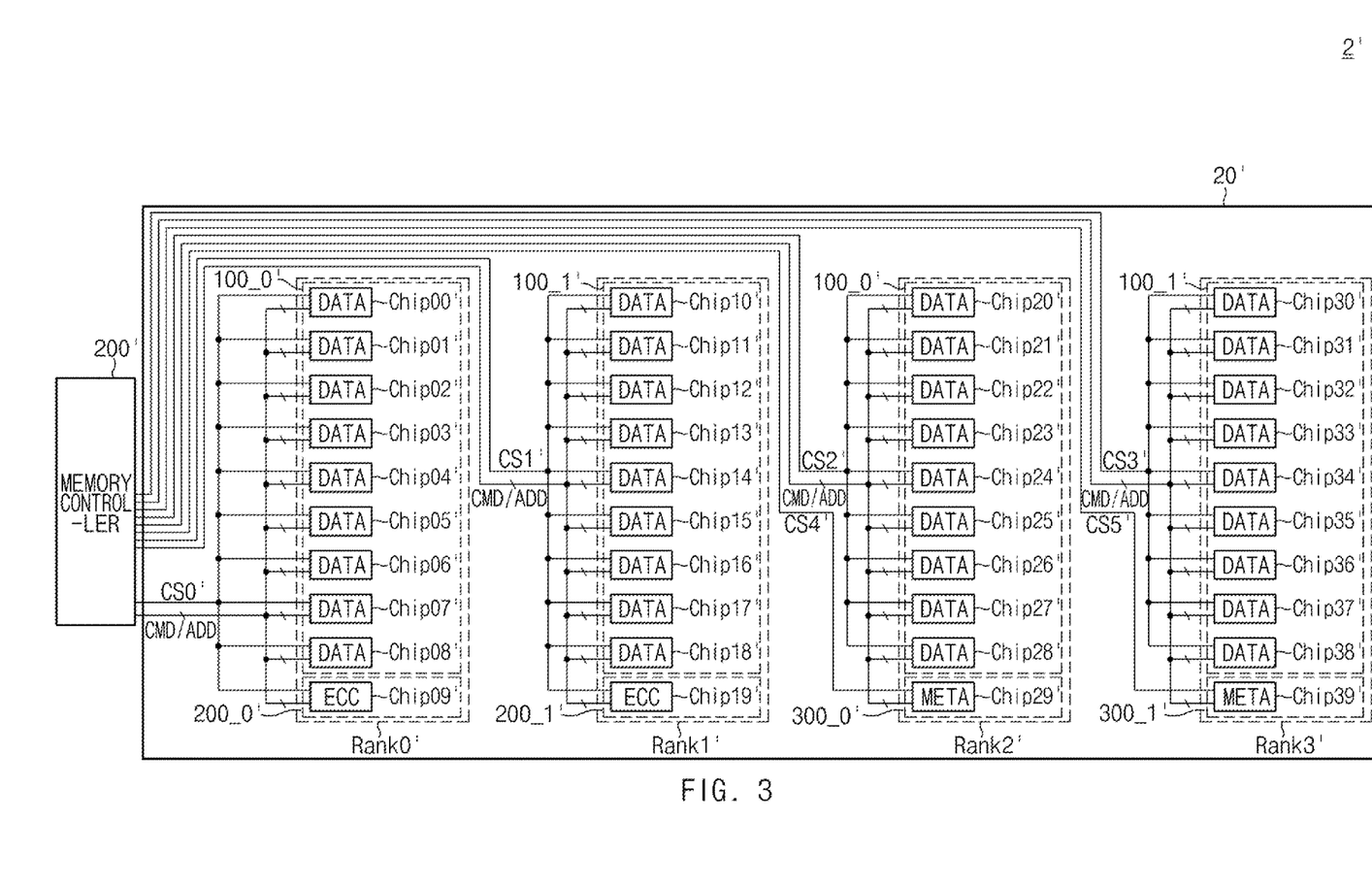
FIG. 3 illustrates a semiconductor device according to an embodiment of the present disclosure.

FIG. 3 illustrates a semiconductor device 2' according to an embodiment of the present disclosure. The semiconductor device 2', a memory controller 200', and a memory device 20' shown in FIG. 3 may respectively correspond to the semiconductor device 2, the memory controller 200, and the memory device 20 shown in FIG. 2.

Referring to FIG. 3, the semiconductor device 2' may include a plurality of ranks, e.g., Rank0', Rank1', Rank2', and Rank3', and each rank may include a plurality of semiconductor chips. For example, the rank Rank0' may include 10 semiconductor chips Chip00'~Chip09', the rank Rank1' may include 10 semiconductor chips Chip10'~Chip19', the rank Rank2' may include 10 semiconductor chips Chip20'~Chip29', and the rank Rank3' may include 10 semiconductor chips Chip30'~Chip39'. Although the semiconductor device 2' includes four ranks and each rank includes 10 semiconductor chips for convenience of description and better understanding of the present disclosure, the scope or spirit of the present disclosure is not limited thereto. The number of ranks and the number of semiconductor chips included in each rank may be changed as necessary. The respective semiconductor chips Chip00'~Chip39' may be identical in size to one another. For example, each of the semiconductor chips Chip00'~Chip39' may have a size of 16 bytes.

In this embodiment shown in FIG. 3, the rank Rank0' and the rank Rank2' may correspond to a page Page0' (not shown), and the rank Rank1' and the rank Rank3' may correspond to a page Page1' (not shown). The page Page0' may include a data region 100_0', an ECC region 200_0', and a metadata region 300_0'. The page Page1' may include a data region 100_1', an ECC region 200_1', and a metadata region 300_1'.

Each data region 100_0' or 100_1' may include a plurality of semiconductor chips, for example, 18 semiconductor chips. For example, the data region 100_0' may include the semiconductor chips Chip00'~Chip08' in the rank Rank0' and the semiconductor chips Chip20'~Chip28' in the rank Rank2'. The data region 100_1' may include the semiconductor chips Chip10'~Chip18' in the rank Rank1' and the semiconductor chips Chip30'~Chip38' in the rank Rank3'.

Meanwhile, the ECC region 200_0' may include the semiconductor chip Chip09' in the rank Rank0', and the ECC region 200_1' may include the semiconductor chip Chip19' in the rank Rank1'. The metadata region 300_0' may include the semiconductor chip Chip29' in the rank Rank2', and the metadata region 300_1' may include the semiconductor chip Chip39' in the rank Rank3'.

In a single rank, semiconductor chips included in a data region and semiconductor chips included in an ECC region may be coupled to the same chip selection signal transmission line. In this embodiment shown in FIG. 3, the semiconductor chips Chip00'~Chip08' in the data region 100_0' of the rank Rank0' and the semiconductor chip Chip09' in the ECC region 200_0' of the rank Rank0' may be coupled to a chip selection signal transmission line CS0'. The semiconductor chips Chip10'~Chip18' in the data region 100_1' of the rank Rank1' and the semiconductor chip Chip19' in the ECC region 200_1' of the rank Rank1' may be coupled to a chip selection signal transmission line CS1'. The semiconductor chips Chip20'~Chip28' in the data region 100_0' of the rank Rank2' may be coupled to a chip selection signal transmission line CS2', and the semiconductor chips Chip30'~Chip38' in the data region 100_1' of the rank Rank3' may be coupled to a chip selection signal transmission line CS3'.

Each semiconductor chip belonging to a metadata region may be coupled to a chip selection signal transmission line that is different from a chip selection signal transmission line connected to a data region. In this embodiment shown in FIG. 3, the semiconductor chip Chip29' corresponding to the metadata region 300_0' may be coupled to a chip selection signal transmission line CS4', and the semiconductor chip Chip39' corresponding to the metadata region 300_1' may be coupled to a chip selection signal transmission line CS5'.

The memory controller 200' may activate the chip selection signals CS0' and CS2' and may deactivate the remaining chip selection signals other than the activated chip selection signals CS0' and CS2', such that it may be possible to access only the data region 100_0' and the ECC region 200_0' of the page Page0' without accessing the metadata region 300_0' of the page Page0'. In this case, the chip selection signal CS0' and the chip selection signal CS2' may be simultaneously activated or may be sequentially activated. In addition, the memory controller 200' may activate the chip selection signal CS4' and may deactivate the remaining chip selection signals other than the chip selection signal CS4', such that it may be possible to access only the metadata region 300_0' without accessing the data region 100_0' and the ECC region 200_0'. Accordingly, the memory controller 200' may access the metadata region 300_0' in the page Page0' separately from the data region 100_0' and the ECC region 200_0' in the page Page0'. Similarly, the memory controller 200' may access the metadata region 300_1' in the page Page1' separately from the data region 100_1' and the ECC region 200_1' in the page Page1'.

In accordance with the semiconductor device 2' shown in FIG. 3, performance deterioration of each metadata region 300_0' or 300_1' may be reduced in the same manner as in the semiconductor device 2 shown in FIG. 2, such that metadata reliability can be guaranteed. In addition, since a single ECC region and a single metadata region in the semiconductor device 2' are disposed in different ranks, the number of semiconductor chips included in the data regions 100_0' and 100_1' of the memory device 20' may be higher than the number of semiconductor chips included in the data regions 100_0 and 100_1 of the memory device 20.

Figure 4:
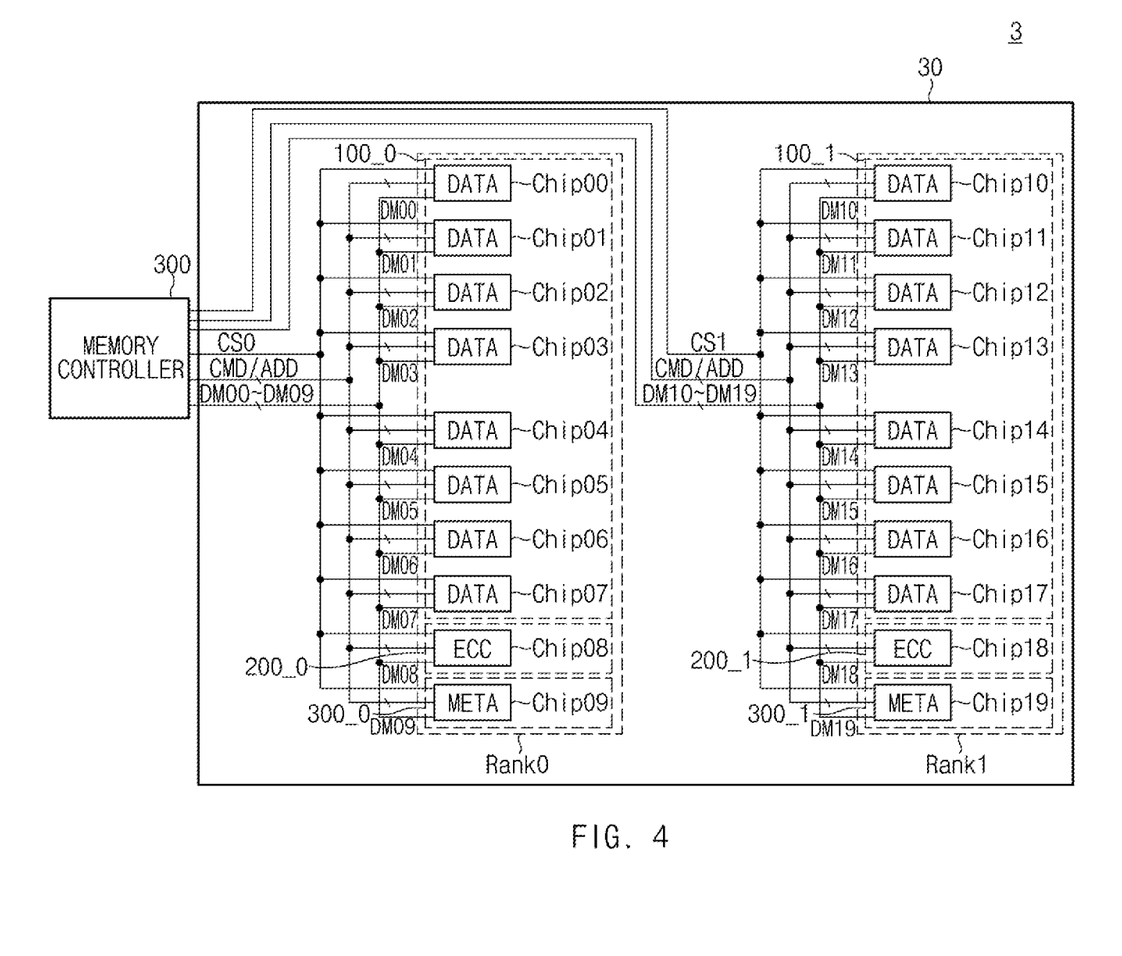
FIG. 4 illustrates a semiconductor device according to an embodiment of the present disclosure.
Figure 5:
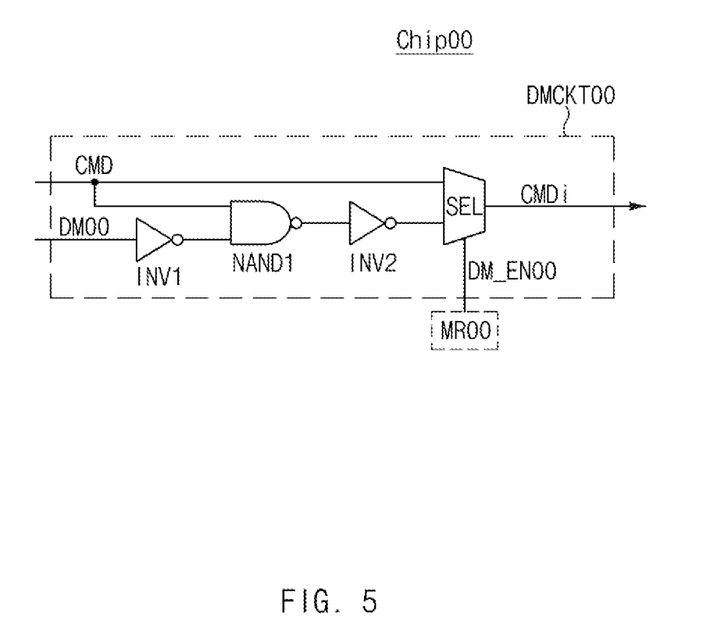
FIG. 5 illustrates selected constituent elements of a semiconductor chip shown in FIG. 4 according to an embodiment of the present disclosure.

FIG. 4 illustrates a semiconductor device 3 according to an embodiment of the present disclosure. FIG. 5 illustrates selected constituent elements of a semiconductor chip Chip00 shown in FIG. 4.

Referring to FIGS. 4 and 5, the semiconductor device 3 may be similar in structure to the semiconductor device 2 shown in FIG. 2. A memory controller 300 and a memory device 30 of the semiconductor device 3 may respectively correspond to the memory controller 200 and the memory device 20 of the semiconductor device 2. The semiconductor device 3 will be described focusing upon characteristics that are different from those of the semiconductor device 2.

In accordance with this embodiment shown in FIG. 4, the same command/address signals CMD/ADD may be input to semiconductor chips belonging to the same rank.

In this embodiment, the semiconductor chips belonging to the same rank may be coupled to the same chip selection signal transmission line and the same command/address transmission line. Referring to FIG. 4, semiconductor chips Chip00~Chip09 belonging to a rank Rank0 may be coupled to a chip selection signal transmission line CS0, and semiconductor chips Chip10~Chip19 belonging to a rank Rank1 may be coupled to a chip selection signal transmission line CS1. That is, in the rank Rank0, the semiconductor chip Chip09 corresponding to a metadata region 300_0, the semiconductor chips Chip00~Chip07 corresponding to a data region 100_0, and the semiconductor chip Chp08 corresponding to an ECC region 200_0 may be coupled to the same chip selection signal transmission line CS0. In the rank Rank1, the semiconductor chip Chip19 corresponding to a metadata region 300_1, the semiconductor chips Chip10~Chip17 corresponding to a data region 100_1, and the semiconductor chip Chip18 corresponding to an ECC region 200_1 may be coupled to the same chip selection signal transmission line CS1.

Referring to FIG. 5, the semiconductor chips Chip00~Chip19 may respectively include control information storage circuits MR00~MR19, and may respectively include data masking circuits DMCKT00~DMCKT19. Although FIG. 5 illustrates, as a representative example, the semiconductor chip Chip00 from among the semiconductor chips Chip00~Chip19 in the ranks Rank0 and Rank1, the configuration and concept of FIG. 5 may also be applied to each of the remaining semiconductor chips Chip01~Chip19 without departing from the scope or spirit of the present disclosure.

The control information storage circuits MR00~MR19 may respectively store data mask information DM_EN00~DM_EN19. For convenience of description and better understanding of the present disclosure, only one control information storage circuit MR00 other than the remaining control information storage circuits MR01~MR19 is exemplarily illustrated in FIG. 5, and only one data mask information DM_EN00 other than the remaining data mask information DM_EN01~DM_EN19 is exemplarily illustrated in FIG. 5.

The data mask information DM_EN00~DM_EN19 stored in the control information storage circuits MR00~MR19 may have the same value. Each of the control information storage circuits MR00~MR19 may be implemented as a mode register. Each of the control information storage circuits MR00~MR19 may store not only data mask information but also control information needed to set one or more operation modes of a corresponding one of the semiconductor chips Chip00~Chip19. An operation for setting a value of the control information in each of the control information storage circuits MR00~MR19, e.g., an operation for setting a mode register set (MRS), may be performed in a power-up mode. The control information may be established or set not only by a mode register set (MRS) command but also by a value applied to each address pin. The established or set control information may be re-programmed, or may remain unchanged until the semiconductor device 3 is powered off. The established or set control information may be initialized by a reset signal (not shown).

Each of the data masking circuits DMCKT00~DMCKT19 may decide whether to perform a write operation based on a corresponding one of data mask signals DM00~DM19 provided by the memory controller 300. For example, the data masking circuit DMCKT00 of the semiconductor chip Chip00 may not perform the write operation although a write command CMD is input to the data masking circuit DMCKT00 when the data mask signal DM00 is activated. The operation for deciding whether to perform the write operation based on the data mask signals DM00~DM19 will hereinafter be referred to as a 'data masking operation.'

The data masking operation may be performed based on the data mask information DM_EN00~DM_EN19 stored in the control information storage circuits MR00~MR19. For example, the data masking circuit DMCKT00 included in the semiconductor chip Chip00 may perform the above-mentioned data masking operation in response to the data mask signal DM00 when the data mask information DM_EN00 stored in the control information storage circuit MR00 is activated, e.g., at a high level. On the other hand, when the data mask information DM_EN00 stored in the control information storage circuit MR00 is deactivated, e.g., at a low level, the data masking circuit DMCKT00 included in the semiconductor chip Chip00 may perform the write operation in response to the write command CMD regardless of a value of the data mask signal DM00.

Referring to FIG. 5, the data masking circuit DMCKT00 may include an inverter INV1 to invert a value of the data mask signal DM00, a NAND operator NAND1 to perform a NAND operation on an output signal of the inverter INV1 and a command CMD, an inverter INV2 to invert an output signal of the NAND operator NAND1, and a multiplexer SEL to selectively output the command CMD or an output signal of the inverter INV2 based on the data mask information DM_EN00 provided by the control information storage circuit MR00. An output signal of the multiplexer SEL may be output as an internal command CMDi.

Although FIG. 5 illustrates, as a representative example, the data masking circuit DMCKT00 included in the semiconductor chip Chip00 for convenience of description, a data masking circuit DMCKT included in each of the remaining semiconductor chips Chip01~Chip19 may be similar in structure to the data masking circuit DMCKT00 of FIG. 5. That is, in each of the semiconductor chips Chip01~Chip19, a corresponding one of the data mask signals DM01~DM19 is input to an inverter INV1, and a corresponding one of the data mask information DM_EN01~DM_EN19 is provided to a multiplexer SEL by a corresponding one of the control information storage circuits MR01~MR19 respectively included in the semiconductor chips Chip01~Chip19.

Referring back to FIG. 4, the memory controller 300 may differently set the data mask signal DM09 or DM19 applied to the metadata region 300_0 or 300_1, the data mask signals DM00~DM07 or DM10~DM17 applied to the data region 100_0 or 100_1, and the data mask signal DM08 or DM18 applied to the ECC region 200_0 or 200_1, respectively. For example, in a write operation for the rank Rank0, the memory controller 300 may activate the chip selection signal CS0, transmit the command/address signals CMD/ADD to the command/address transmission line corresponding to the rank Rank0, deactivate the data mask signal DM09 of the semiconductor chip Chip09 corresponding to the metadata region 300_0, activate the data mask signals DM00~DM07 of the semiconductor chips Chip00~Chip07 corresponding to the data region 100_0, and activate the data mask signal DM08 of the semiconductor chip Chip08 corresponding to the ECC region 200_0, such that the memory controller 300 may write metadata in the metadata region 300_0 of the page Page0. That is, the write operation may be performed in the semiconductor chip Chip09 corresponding to the metadata region 300_0, and the write operation may not be performed in the remaining semiconductor chips Chip00~Chip08 of the page Page0.

Alternatively, in the write operation, the memory controller 300 may activate the chip selection signal CS0, transmit the command/address signals CMD/ADD to the command/address transmission line corresponding to the rank Rank0, deactivate the data mask signals DM00~DM07 of the semiconductor chips Chip00~Chip07 of the data region 100_0, deactivate the data mask signal DM08 of the semiconductor chip Chip08 of the ECC region 200_0, and activate the data mask signal DM09 of the semiconductor chip Chip09 corresponding to the metadata region 300_0, such that the memory controller 300 may write data in the data region 100_0 of the page Page0 and simultaneously write ECC data in the ECC region 200_0 of the page Page0. That is, the write operation may be performed in the semiconductor chips Chip00~Chip07 corresponding to the data region 100_0 and in the semiconductor chip Chip08 corresponding to the ECC region 200_0. At this time, the write operation may not be performed in the semiconductor chip Chip09 corresponding to the metadata region 300_0 of the page Page0. The above-mentioned write operations may also be applied to the semiconductor chips Chip10~Chip19 corresponding to the page Page1 without departing from the scope or spirit of the present disclosure.

In the semiconductor device 3 shown in FIG. 4, although the data region, the ECC region, and the metadata region in the rank are coupled to one chip selection signal line, the metadata region is accessed separately from the data region and the ECC region by performing the data masking operation based on the data mask signals, e.g., DM00~DM09 or DM10~DM19. Therefore, the number of access times of each of the metadata regions 300_0 and 300_1 can be reduced, resulting in increased reliability of the metadata stored in the metadata regions 300_0 and 300_1.

Figure 6:
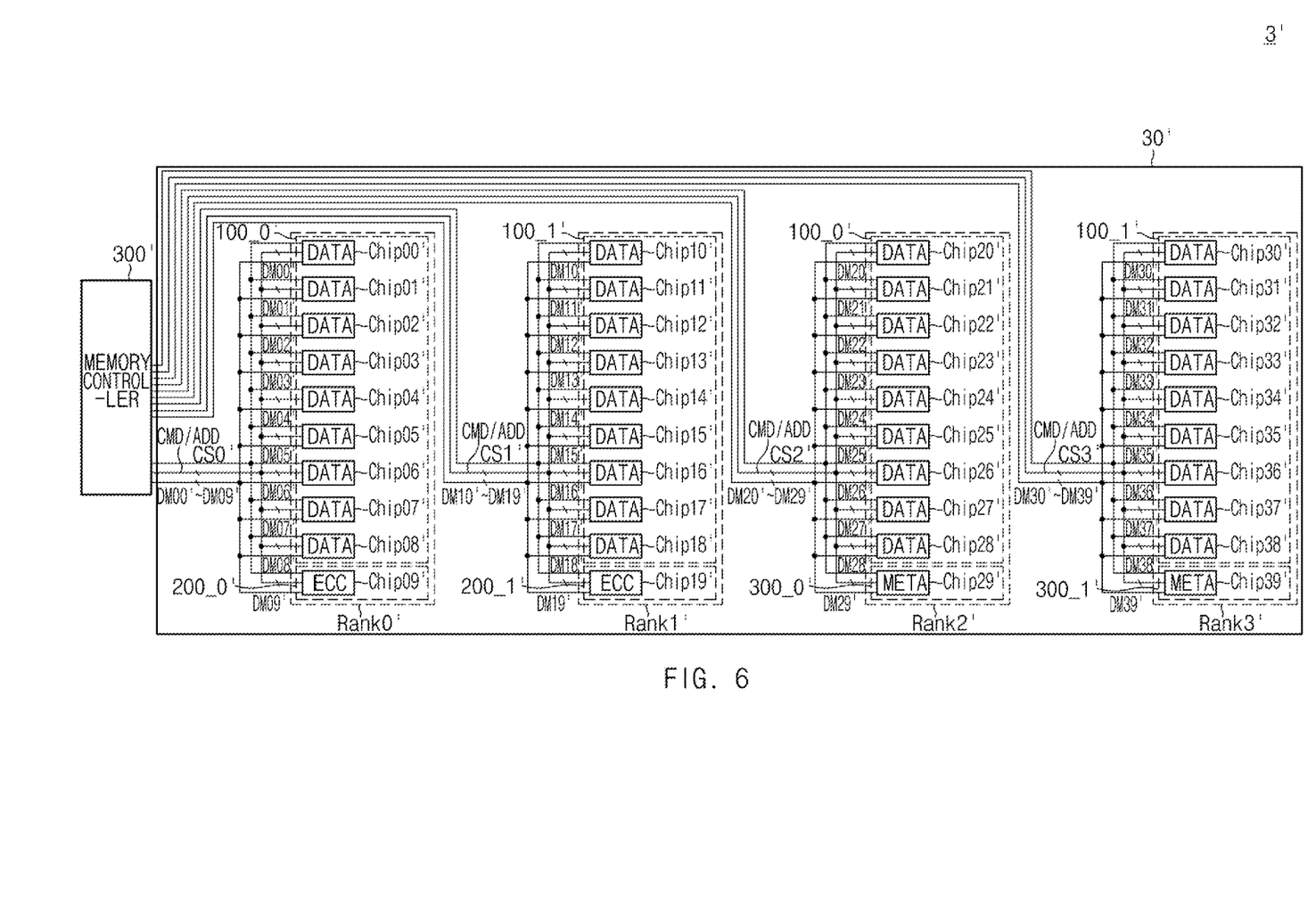
FIG. 6 illustrates a semiconductor device according to an embodiment of the present disclosure.

FIG. 6 illustrates a semiconductor device 3' according to an embodiment of the present disclosure.

A memory controller 300' and a memory device 30' of the semiconductor device 3' illustrated in FIG. 6 may respectively correspond to the memory controller 200' and the memory device 20' of the semiconductor device 2' illustrated in FIG. 3. Differently from the semiconductor device 2', the semiconductor device 3' includes semiconductor chips Chip00'~Chip09', Chip10'~Chip19', Chip20'~Chip29', and Chip30'~Chip39' belonging to rank Rank0', Rank1', Rank2', and Rank3' that are coupled to chip selection signal transmission line CS0', CS1', CS2', and CS3', respectively. In addition, the memory controller 300' may transmit data mask signals DM00'~DM39' to the semiconductor chips Chip00'~Chip39', respectively. The ranks Rank0' and Rank2' may correspond to a page Page0', and the ranks Rank1' and Rank3' may correspond to a page Page1'.

The memory controller 300' may deactivate the data mask signals DM00'~DM09' respectively applied to the semiconductor chips Chip00'~Chip09' of a data region 100_0' and an ECC region 200_0' in the rank Rank0' of the page Page0', deactivate the data mask signals DM20'~DM28' respectively applied to the semiconductor chips Chip20'~Chip28' of the data region 100_0' in the rank Rank2' of the page Page0', and activate the data mask signal DM29' applied to the semiconductor chip Chip29' corresponding to a metadata region 300_0' in the rank Rank2' of the page Page0', such that a write operation may be performed in the data region 100_0' and the ECC region 200_0' of the page Page0 and the write operation may not be performed in the metadata region 300_0' of the page Page0'.

On the other hand, the memory controller 300' may activate the data mask signals DM00'~DM09' respectively applied to the semiconductor chips Chip00'~Chip09' corresponding to the data region 100_0' and the ECC region 200_0' in the rank Rank0' of the page Page0', activate the data mask signals DM20'~DM28' respectively applied to the semiconductor chips Chip20'~Chip28' corresponding to the data region 100_0' in the rank Rank2' of the page Page0', and deactivate the data mask signal DM29' applied to the semiconductor chip Chip29' corresponding to the metadata region 300_0' in the rank Rank2' of the page Page0', such that the write operation may be performed in the metadata region 300_0' of the page Page0' and may not be performed in the data region 100_0' and the ECC region 200_0' of the page Page0'.

In the semiconductor device 3' shown in FIG. 6, although the data region, the ECC region, and the metadata region in each of the ranks Rank0'~Rank3' are coupled to the same chip selection signal transmission line, the semiconductor device 3' may access the metadata regions 300_0' and 300_1' separately from the data regions 100_0' and 100_1' and the ECC regions 200_0' and 200_1' by performing the data masking operation based on the data mask signals, e.g., DM00~DM39. Therefore, the number of access times of each of the metadata regions 300_0' and 300_1' can be reduced, such that the reliability of the metadata stored in the metadata regions 300_0' and 300_1' can be increased. In addition, since two ranks correspond to a single page, and an ECC region and a metadata region are separately disposed in the two ranks, the number of semiconductor chips included in a data region in each page can be increased.

Figure 7:
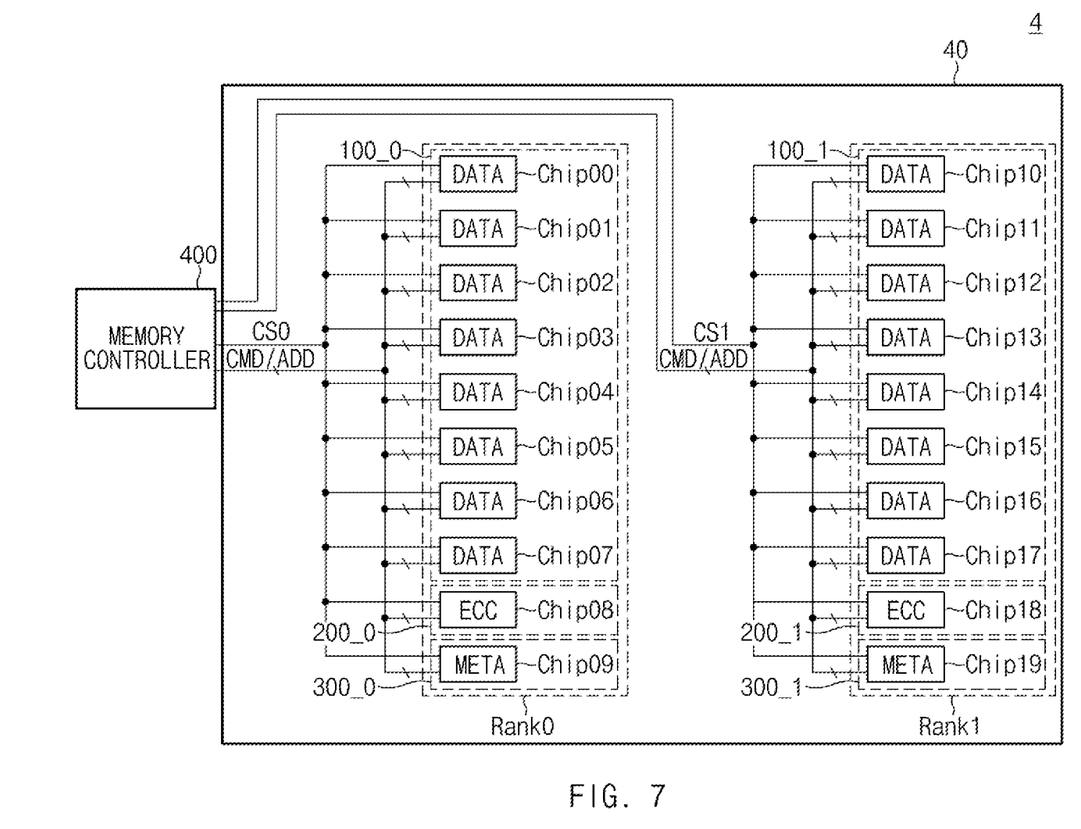
FIG. 7 illustrates a semiconductor device according to an embodiment of the present disclosure.
Figure 8:
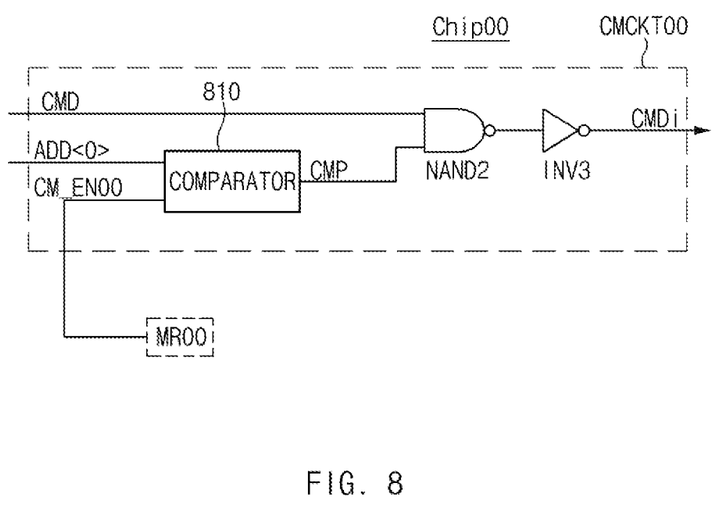
FIG. 8 illustrates selected constituent elements of a semiconductor chip shown in FIG. 7 according to an embodiment of the present disclosure.

FIG. 7 illustrates a semiconductor device 4 according to an embodiment of the present disclosure. FIG. 8 illustrates selected constituent elements of a semiconductor chip Chip00 shown in FIG. 7.

Referring to FIGS. 7 and 8, the semiconductor device 4 may be similar in structure to the semiconductor device 2 shown in FIG. 2. A memory controller 400 and a memory device 40 of the semiconductor device 4 may respectively correspond to the memory controller 200 and the memory device 20 of the semiconductor device 2. The semiconductor device 4 will be described focusing upon characteristics that are different from those of the semiconductor device 2.

In this embodiment shown in FIG. 7, semiconductor chips included in the same rank may be coupled to the same chip selection signal transmission line. A chip selection signal CS0 may be commonly applied to semiconductor chips Chip00~Chip09 included in a rank Rank0, and a chip selection signal CS1 may be commonly applied to semiconductor chips Chip10~Chip19 included in a rank Rank1.

In this embodiment, each of the semiconductor chip Chip00~Chip19 may include a control information storage circuit MR and a command masking circuit CMCKT. FIG. 8 illustrates a control information storage circuit MR00 and a command masking circuit CMCKT00 included in the semiconductor chip Chip00. Although FIG. 8 illustrates only the semiconductor chip Chip00 from among the semiconductor chips Chip00~Chip19 shown in FIG. 7 for convenience of description, the scope or spirit of the present disclosure is not limited thereto. The configuration and concept of FIG. 8 may also be applied to each of the semiconductor chips Chip01~Chip19 without departing from the scope or spirit of the present disclosure.

Control information storage circuits MR00~MR19 may respectively store command mask information CM_EN00~CM_EN19. For the rank Rank0, the memory controller 400 may set the command mask information CM_EN00~CM_EN08 stored in the semiconductor chips Chip00~Chip08 that correspond to data and ECC regions 100_0 and 200_0 to be different in level from the command mask information CM_EN09 stored in the semiconductor chip Chip09 that corresponds to a metadata region 300_0. For the rank Rank1, the memory controller 400 may set the command mask information CM_EN10~CM_EN18 stored in the semiconductor chips Chip10~Chip18 that correspond to data and ECC regions 100_1 and 200_1 to be different in level from the command mask information CM_EN19 stored in the semiconductor chip Chip19 that corresponds to a metadata region 300_1.

A command masking circuit CMCKT may decide whether to perform a command (CMD)-based operation, upon receiving not only a corresponding one of the command mask information CM_EN00~CM_EN19 stored in the control information storage circuits MR00~MR19, but also a value of a specific bit of an address signal ADD. For example, when any of the command mask information CM_EN00~CM_EN19 is identical in value to the specific bit of the address signal ADD, the corresponding command masking circuit CMCKT may perform a command masking operation, such that the command masking circuit CMCKT may not perform the CMD-based operation. In other words, when any of the command mask information CM_EN00~CM_EN19 is different in level from the specific bit of the address signal ADD, the corresponding command masking circuit CMCKT may decide to perform the CMD-based operation. The CMD-based operation represents an operation corresponding to a command CMD.

In the memory device 40, the address signal ADD may be commonly applied to the semiconductor chips corresponding to the same rank. The command masking circuit CMCKT according to this embodiment may perform the command masking operation using preset command mask information and a specific bit of the address signal ADD, such that the semiconductor device 4 may access the metadata region 300_0 or 300_1 separately from the data region 100_0 or 100_1 and the ECC region 200_0 or 200_1, respectively.

For example, the memory controller 400 may set the command mask information CM_EN00~CM_EN08 corresponding to the data region 100_0 and the ECC region 200_0 to a low level, and set the command mask information CM_EN09 corresponding to the metadata region 300_0 to a high level. The memory controller 400 may set the command mask information CM_EN10~CM_EN18 corresponding to the data region 100_1 and the ECC region 200_1 to a low level, and set the command mask information CM_EN19 corresponding to the metadata region 300_1 to a high level. At this time, the memory controller 400 may activate the chip selection signal CS0, and at the same time may transmit a write command CMD and the address signal ADD to the semiconductor chips Chip00~Chip09 corresponding to the rank Rank0. In this case, the memory controller 400 may set the specific bit of the address signal ADD to a high level. In this case, since each of the command mask information CM_EN00~CM_EN08 corresponding to the data region 100_0 and the ECC region 200_0 has a different level from the specific bit of the address signal ADD, the command masking operation is not performed and thus a write operation is performed in the data region 100_0 and the ECC region 200_0. On the other hand, since the command mask information CM_EN09 corresponding to the metadata region 300_0 and the specific bit of the address signal ADD are set to the same high level, the command masking operation is performed and thus the write operation is not performed in the metadata region 300_0.

In contrast, when the specific bit of the address signal ADD is set to a low level, the command masking operation is performed in the data region 100_0 and the ECC region 200_0, such that the write operation is not performed in the data region 100_0 and the ECC region 200_0, and the write operation is performed in the metadata region 300_0.

Although the above-mentioned embodiment has been disclosed using the rank Rank0 (i.e., Page0) as an example for convenience of description, it should be noted that the semiconductor device 4 can perform the command masking operation and the write operation for the rank Rank1 (i.e., Page1) in the same manner as in the rank Rank0 (i.e., Page0).

FIG. 8 is a circuit diagram illustrating the command masking circuit CMCKT00 included in the semiconductor chip Chip00 shown in FIG. 7. Referring to FIG. 8, the command masking circuit CMCKT00 may include a comparator 810, a NAND operator NAND2, and an inverter INV3.

The comparator 810 may generate a comparison signal CMP by comparing the specific bit ADD<0> of the address signal ADD with the command mask information CM_EN00 provided by the control information storage circuit MR00. For example, when the specific bit ADD<0> of the address signal ADD has the same value as the command mask information CM_EN00, the comparator 810 may generate the comparison signal CMP having, e.g., a high level. When the specific bit ADD<0> of the address signal ADD has a different value from the command mask information CM_EN00, the comparator 810 may generate the comparison signal CMP having, e.g., a low level. The NAND operator NAND2 may perform a NAND operation on the comparison signal CMP and the command CMD. The inverter INV3 may invert an output signal of the NAND operator NAND2, and an output signal of the inverter INV3 is provided as an internal command CMDi.

Although FIG. 8 illustrates the command masking circuit CMCKT00 included in the semiconductor chip Chip00 as a representative example, the command masking circuits respectively included in the semiconductor chips Chip01~Chip19 may be identical in structure to the command masking circuit CMCKT00 shown in FIG. 8. In this case, the same specific bit ADD<0> of the address signal ADD may be applied to the command masking circuits respectively included in the semiconductor chips Chip01~Chip19, and each of the command mask information CM_EN01~CM_EN19 may be applied to a corresponding comparator 810.

In the semiconductor device 4, when semiconductor chips included in each rank are coupled to the same chip selection signal transmission line, the semiconductor device 4 may access the metadata region 300_0 or 300_1 separately from the data region 100_0 or 100_1 and the ECC region 200_0 or 200_1 by performing the command masking operation based on the command mask information CM_EN and the specific bit of the address ADD without transmitting a separate signal (e.g., a data mask signal) to the semiconductor chips. Therefore, the semiconductor device 4 may prevent the metadata region 300_0 or 300_1 from being unnecessarily accessed, resulting in increased reliability of metadata stored in the metadata regions 300_0 and 300_1.

Figure 9:
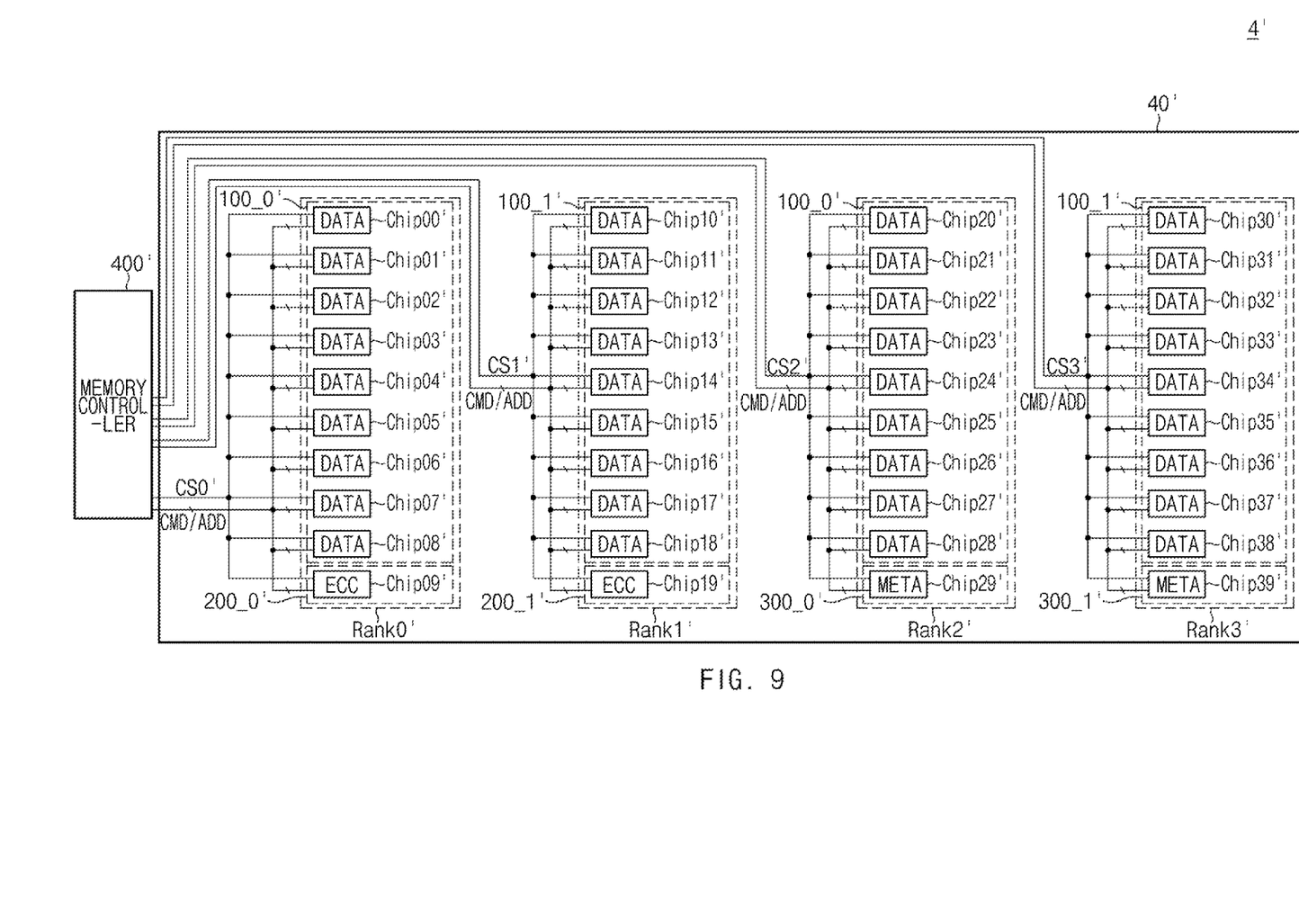
FIG. 9 illustrates a semiconductor device according to an embodiment of the present disclosure.

FIG. 9 illustrates a semiconductor device 4' according to an embodiment of the present disclosure.

Referring to FIG. 9, the semiconductor device 4' may include a memory controller 400' and a memory device 40'. The memory controller 400' and the memory device 40' of the semiconductor device 4' shown in FIG. 9 may respectively correspond to the memory controller 200' and the memory device 20' of the semiconductor device 2' shown in FIG. 3. The semiconductor device 4' will be described focusing upon characteristics that are different from those of the semiconductor device 2'.

In this embodiment shown in FIG. 9, semiconductor chips corresponding to the same rank may be coupled to the same chip selection signal transmission line. Therefore, a chip selection signal CS0' may be transmitted to semiconductor chips Chip00'~Chip09' of a rank Rank0', a chip selection signal CS1' may be transmitted to semiconductor chips Chip10'~Chip19' corresponding to a rank Rank1', a chip selection signal CS2' may be transmitted to semiconductor chips Chip20'~Chip29' corresponding to a rank Rank2', and a chip selection signal CS3' may be transmitted to semiconductor chips Chip30'~Chip39' corresponding to a rank Rank3'. The ranks Rank0' and Rank2' may correspond to a page Page0', and the ranks Rank1' and Rank3' may correspond to a page Page1'.

The semiconductor chips Chip00'~Chip39' may respectively include control information storage circuits MR00'~MR39' (not shown), and each of the semiconductor chips Chip00'~Chip39' may further include a command masking circuit CMCKT' (not shown). Each of the control information storage circuits MR00'~MR39' of the semiconductor device 4' may correspond to the control information storage circuit MR00 of the semiconductor device 4 shown in FIG. 8. The command masking circuit CMCKT' of the semiconductor device 4' may correspond to the command masking circuit CMCKT of the semiconductor device 4, e.g., the command masking circuit CMCKT00 shown in FIG. 8.

The control information storage circuits MR00'~MR39' may respectively store command mask information CM_EN00'~CM_EN39' (not shown). The memory controller 400' may set the command mask information CM_EN29' corresponding to the metadata region 300_0' and the command mask information CM_EN39' corresponding to the metadata region 300_1' to be different in level from the command mask information CM_EN00'~CM_EN09', CM_EN10'~CM_EN19', CM_EN20'~CM_EN28', and CM_EN30'~CM_EN38' corresponding to the data regions 100_0' and 100_1' and the ECC regions 200_0' and 200_1'. The command masking circuit CMCKT' may decide whether to perform an operation of a command CMD based on not only a corresponding one of command mask information CM_EN00'~CM_EN39' but also a value of a specific bit of an address signal ADD.

In this embodiment shown in FIG. 9, the memory controller 400' may set each of the command mask information CM_EN00'~CM_EN09', CM_EN10'_CM_EN19', CM_EN20'~CM_EN28', and CM_EN30'~CM_EN38' corresponding to the data regions 100_0' and 100_1' and the ECC regions 200_0' and 200_1' to a low level, and set each of the command mask information CM_EN29' corresponding to the metadata region 300_0 and the command mask information CM_EN39' corresponding to the metadata region 300_1 to a high level. In this case, the memory controller 400' may activate the chip selection signals CS0' and CS2' to access the page Page0', and at the same time may transmit a write command CMD and the address signal ADD not only to the semiconductor chips Chip00'~Chip09' corresponding to the rank Rank0', but also to the semiconductor chips Chip20'~Chip29' corresponding to the rank Rank2'. In this case, the memory controller 400' may set a value of the specific bit of the address signal ADD to a high level. In this case, since the command mask information CM_EN00'~CM_EN09' and CM_EN20'~CM_EN28' corresponding to the data region 100_0' and the ECC region 200_0' are different from the value of the specific bit of the address signal ADD, a command masking operation is not performed and a write operation is performed in the data region 100_0' and the ECC region 200_0'. On the other hand, since the command mask information CM_EN29' corresponding to the metadata region 300_0' and the specific bit of the address signal ADD are set to the same high level, the command masking operation is performed in the metadata region 300_0'.

On the other hand, when the specific bit of the address signal ADD is at a low level, the command masking operation is performed in the data region 100_0' and the ECC region 200_0', and the write operation is performed in the metadata region 300_0'.

Although the above-mentioned embodiment has been disclosed using the page Page0' as an example for convenience of description, the semiconductor device 4' can perform the command masking operation and the write operation for the ranks Rank1' and Rank 3' corresponding to the page Page1' in the same manner as in the ranks Rank0' and Rank2' corresponding to the page Page0'.

In the semiconductor device 4' shown in FIG. 9, although semiconductor chips included in each rank are coupled to the same chip selection signal transmission line, the semiconductor device 4' may access the metadata regions 300_0' and 300_1' separately from the data regions 100_0' and 100_1' and the ECC regions 200_0' and 200_1' by performing the command masking operation based on the command mask information CM_EN and the specific bit of the address signal AMD without transmitting a separate signal (e.g., a data mask signal) to the semiconductor chips. Therefore, the semiconductor device 4' may prevent the metadata regions 300_0' and 300_1' from being unnecessarily accessed, resulting in increased reliability of metadata stored in the metadata regions 300_0' and 300_1'. In addition, since a single page corresponds to two ranks and an ECC region and a metadata region are separately disposed in the two ranks, the number of semiconductor chips included in a data region in each page can be increased.

The embodiments of the present disclosure have been described above for illustrative purposes. The scope or spirit of the present disclosure is not limited to the above-mentioned embodiments and the attached drawings thereof. Further, it should be noted that the present disclosure may be achieved in various ways through substitution, modification, and change by those skilled in the art without departing from the scope of the present disclosure.

In FIGS. 2~4, 6, 7, and 9, the semiconductor chips Chip00~Chip39 and Chip00'~Chip39' and the data regions 100_0, 100_1, 100_0', and 100_1', the ECC regions 200_0, 200_1, 200_0', and 200_1', the metadata regions 300_0, 300_1, 300_0', and 300_1', and the ranks Rank0~Rank3 and Rank0'~Rank3' may be used to indicate the inclusion relationship or connection relationship, and may not correspond to physical arrangement as necessary. For example, although the ranks Rank0~Rank3 or the ranks Rank0'~Rank3' are horizontally arranged parallel to one another for convenience of description and better understanding of the present disclosure, it should be noted that the ranks Rank0~Rank3 or the ranks Rank0'~Rank3' can also be vertically stacked. In addition, the ranks Rank0~Rank3 or the ranks Rank0'~Rank3' can also be horizontally and vertically stacked. For example, each of the ranks Rank0 and Rank1 and the ranks Rank2 and Rank3 are horizontally arranged, and the ranks Rank0 and Rank1 and the ranks Rank2 and Rank3 are vertically arranged.

Moreover, although the semiconductor devices 1, 2, 2', 3, 3', 4, and 4' include the ECC regions 12, 200_0, 200_1, 200_0', and 200_1' for convenience of description, the scope or spirit of the present disclosure is not limited thereto, and the ECC regions 12, 200_0, 200_1, 200_0', and 200_1' may be omitted as necessary.

A1. A semiconductor device comprising:
  a data region including a plurality of first semiconductor chips and configured to store data requested by a host; and
  a metadata region including one or more second semiconductor chips and configured to store metadata corresponding to the plurality of first semiconductor chips in the data region,
  wherein the data region and the metadata region are accessed using different signals to perform a command-based operation corresponding to a command signal.

A2. The semiconductor device according to A1,
  wherein the data region and the metadata region are accessed by a single chip selection signal,
  wherein each of the plurality of first and second semiconductor chips receives a corresponding data mask signal, and
  wherein each of the plurality of first and second semiconductor chips includes:
  a data masking circuit configured to perform a data masking operation for deciding whether to perform the command-based operation in response to the corresponding data mask signal.

A3. The semiconductor device according to A2, wherein each of the first and second semiconductor chips further includes a control information storage circuit that stores corresponding data mask information, and
  wherein the data masking circuit is configured to perform the data masking operation based on the corresponding data mask information.

A4. The semiconductor device according to A2, further comprising:
  a controller configured to set a first data mask signal applied to each semiconductor chip included in the data region to be a different level from a second data mask signal applied to each semiconductor chip included in the metadata region,
  wherein the command-based operation is performed in one of the data region and the metadata region based on the first data mask signal and the second data mask signal.

A5. The semiconductor device according to A4, further comprising:
  an ECC region including one or more third semiconductor chips, each of which includes a data masking circuit,
  wherein the controller is configured to allow a third data mask signal applied to each semiconductor chip in the ECC region to have the same level as the first data mask signal, and wherein the command-based operation is performed in the ECC region based on the third data mask signal.

A6. The semiconductor device according to A4, wherein the data region is a first data region, the single chip selection signal is a first chip selection signal, and the first data region and the metadata region form a first rank, and
  wherein the semiconductor device further comprises a second rank including:
  a second data region including a plurality of third semiconductor chips; and
  an ECC region including one or more fourth semiconductor chips,
  wherein the second data region and the ECC region are accessed by a second chip selection signal,
  wherein the plurality of third and fourth semiconductor chips receive a plurality of data mask signals, respectively, and
  wherein each of the plurality of third and fourth semiconductor chips includes a data masking circuit.

A7. The semiconductor device according to A6, wherein the controller is configured to allow that the first data mask signal applied to each semiconductor chip in the first data region, a third data mask signal applied to each semiconductor chip in the second data region, and a fourth data mask signal applied to each semiconductor chip in the ECC region are set to a same level.

A8. The semiconductor device according to A1,
  wherein the data region and the metadata region are accessed by a single chip selection signal, and receives an address signal,
  wherein each of the first and second semiconductor chips includes:
  a command masking circuit configured to decide whether to perform the command-based operation based on a value of a predetermined bit of the address signal.

A9. The semiconductor device according to A8, wherein a command masking circuit of each semiconductor chip in the data region makes first decision for performing the command-based operation based on the value of the predetermined bit of the address signal,
  wherein a command masking circuit of each semiconductor chip in the metadata region makes second decision for performing the command-based operation based on the value of the predetermined bit of the address signal, and
  wherein the first decision and the second decision are opposite to each other.

A10. The semiconductor device according to A9, wherein each of the first and second semiconductor chips further includes a control information storage circuit configured to store corresponding command mask information, and wherein the command masking circuit decides whether to perform the command-based operation based on a result of comparing the corresponding command mask information and the value of the predetermined bit of the address signal.

A11. The semiconductor device according to A10, wherein command mask information of each semiconductor chip in the data region has a different level from command mask information of each semiconductor chip in the metadata region.

A12. The semiconductor device according to A11, further comprising:

a controller configured to set the value of the predetermined bit of the address signal in order to decide whether to perform the command-based operation in the data region or the metadata region.

A13. The semiconductor device according to A8, further comprising an ECC region that includes one or more third semiconductor chips, each of which includes a command masking circuit, wherein a command masking circuit of each semiconductor chip in the data region makes first decision for performing the command-based operation, and a command masking circuit of each semiconductor chip in the ECC region makes second decision for performing the command-based operation, and wherein the first decision is identical to the second decision.

A14. The semiconductor device according to A8, wherein the data region is a first data region, the single chip selection signal is a first chip selection signal, and the address signal is a first address signal, wherein the first data region and the metadata region form a first rank, and wherein the semiconductor device further comprises a second rank including:

a second data region including a plurality of third semiconductor chips; and an ECC region including one or more fourth semiconductor chips, wherein the second data region and the ECC region are accessed by a second chip selection signal, and receives a second address signal, wherein each of the plurality of third and fourth semiconductor chips includes a command masking circuit.

A15. The semiconductor device according to A14, wherein a command masking circuit of each semiconductor chip in the second data region makes first decision for performing the command-based operation based on a value of a predetermined bit of the second address signal, and a command masking circuit of each semiconductor chip in the ECC region makes second decision for performing the command-based operation based on the value of the predetermined bit of the second address signal, and wherein the first decision is identical to the second decision.

A16. The semiconductor device according to A15, further comprising:

a controller configured to set the value of the predetermined bit of each of the first and second address signals in order to decide whether to perform the command-based operation in the first and second data regions and the ECC region or in the metadata region.

The above-mentioned description has disclosed detailed explanation of the embodiments of the invention. For reference, the embodiments may include additional structures for better understanding of the invention as necessary although the additional structures are not directly associated with technical ideas of the present disclosure. In addition, the Active High or Active Low constructions for indicating deactivation states of a signal and circuit may be changed according to the embodiment. The above-mentioned circuit modification may be very frequently generated, such that a very high number of cases may exist and associated modification can be easily appreciated by those skilled in the art, and as such a detailed description thereof will herein be omitted for convenience of description.

As is apparent from the above description, the semiconductor device according to the embodiments may separately access a data region storing general data from a metadata region storing metadata.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:

a first rank including a plurality of first semiconductor chips coupled to a first chip selection signal transmission line, a first command transmission line, a first address transmission line, and a controller, each of the plurality of first semiconductor chips being coupled to a corresponding one of a plurality of first data mask transmission lines, wherein the controller is configured to allow a data mask signal to be applied to the first semiconductor chip, wherein the first rank includes:

a first data region including a first set of the first semiconductor chips; and a metadata region including a second set of the first semiconductor chips, wherein the metadata region stores metadata including information about a lifetime of the semiconductor device, wherein each of the first semiconductor chips includes:

a control information storage circuit storing corresponding data mask information; and a data masking circuit configured to generate a result of a data masking operation based on a corresponding data mask signal, wherein the data masking circuit is further configured to output the result of the data masking operation when the corresponding data mask information has an activation value, and output a command signal when the corresponding data mask information has a deactivation value, wherein the data mask information stored in each of the first semiconductor chips has a same value, and wherein the data masking operation is an operation of deciding whether to perform an operation corresponding to the command signal in response to the corresponding data mask signal.

2. The semiconductor device according to claim 1, wherein the controller is further configured to allow a first data mask signal applied to a semiconductor chip included in the first data region to be different in level from a second data mask signal applied to a semiconductor chip included in the metadata region, and wherein the data masking operation is inactivated in one of the first data region and the metadata region while it is performed in the other of the first data region and the metadata region.

3. The semiconductor device according to claim 2, wherein the first rank further includes:

a first error correction code (ECC) region including a third set of the first semiconductor chips.

4. The semiconductor device according to claim 3, wherein the controller is configured to allow that the first data mask signal applied to each semiconductor chip corresponding to the first data region is identical in level to a third data mask signal applied to each semiconductor chip corresponding to the first ECC region, such that the data masking operation is performed in both the first data region and the first ECC region.

5. The semiconductor device according to claim 2, further comprising:

a second rank including a plurality of second semiconductor chips coupled to a second chip selection signal transmission line, a second command transmission line, and a second address transmission line, the plurality of second semiconductor chips being coupled to a plurality of second data mask transmission lines, respectively, wherein the second rank includes:

a second data region including a first set of the second semiconductor chips; and a second error correction code (ECC) region including a second set of the second semiconductor chips, wherein—each of the second semiconductor chips includes the data masking circuit.

6. The semiconductor device according to claim 5, wherein the controller is configured to allow that the first data mask signal applied to a semiconductor chip corresponding to the first data region, a third data mask signal applied to a semiconductor chip corresponding to the second data region, and a fourth data mask signal applied to a semiconductor chip corresponding to the second ECC region are set to have a same level.

* * * * *